United States Patent [19]
Yoo et al.

[11] Patent Number: 5,761,146
[45] Date of Patent: Jun. 2, 1998

[54] DATA IN/OUT CHANNEL CONTROL CIRCUIT OF SEMICONDUCTOR MEMORY DEVICE HAVING MULTI-BANK STRUCTURE

[75] Inventors: Jei-Hwan Yoo; Bok-Moon Kang, both of Suwon, Rep. of Korea

[73] Assignee: Samsung Electronics Co., Ltd., Suwon, Rep. of Korea

[21] Appl. No.: 770,673

[22] Filed: Dec. 20, 1996

[30] Foreign Application Priority Data

Dec. 28, 1995 [KR] Rep. of Korea ............... 61226/1995

[51] Int. Cl.$^6$ ............... G11C 8/00; G11C 16/04; G11C 7/00; G11C 7/02
[52] U.S. Cl. ............... 365/230.03; 365/230.06; 365/189.08; 365/203; 365/207
[58] Field of Search ............... 365/230.03, 230.06, 365/189.08, 203, 207, 189.01

[56] References Cited

U.S. PATENT DOCUMENTS

| | | | |
|---|---|---|---|
| 5,297,102 | 3/1994 | Tanizaki | 365/230.03 |
| 5,381,367 | 1/1995 | Kajimoto | 365/189.01 |

*Primary Examiner*—David C. Nelms
*Assistant Examiner*—Trong Phan
*Attorney, Agent, or Firm*—Marger, Johnson, McCollom & Stolowitz, P.C.

[57] ABSTRACT

A data in/out channel control circuit for a semiconductor memory device with multi-bank structure includes a plurality of split banks each provided with memory cell arrays, each split bank having a plurality of bit line pairs and a sub in/out line pair connected through a column selection transistor pair, for efficiently connecting data from the bit line pairs to a global in/out line pair. The circuit enables transmission of only the data in a given block bank through the global in/out line pair and the sub in/out line pairs with bank selection information and block selection information. The circuit includes a pair of global in/out lines, global column selection lines extending in a direction of the bit line pair, a column decoding means for activation of any one of the global column selection lines responsive to a decoding of the column selection information, local column selection lines connected to each gate of the column selection transistors, means for generating a bank selection signal for selecting at least one of the plurality of banks by decoding column selection information and row selection information, and a switching means for connecting the sub in/out line pair of the corresponding bank to the global in/out line pair as well as connecting the global column selection line to the local column selection line of the bank in response to the bank selection signal.

12 Claims, 3 Drawing Sheets

5,761,146

1

DATA IN/OUT CHANNEL CONTROL CIRCUIT OF SEMICONDUCTOR MEMORY DEVICE HAVING MULTI-BANK STRUCTURE

BACKGROUND OF THE INVENTION

1. Field of the Invention

The present invention relates to a data in/out channel control circuit for use in a semiconductor memory device, and more particularly to such a data in/out channel control circuit for efficient transmission of data from a bit line pair of memory cell arrays with multi-bank structure to a global in/out pair line.

2. Description of the Related Art

As recent semiconductor memory devices or memory arrays are highly advanced in the capacity and integration density, a chip size of a memory device tends to become larger and larger, resulting in the increase of a number of memory cell arrays corresponding to each column or row. Thus, as the number of memory cell arrays corresponding to each row or column is increased, its input/output loading is also increased, which inevitably tends to lead to the increase of a cell array portion operating simultaneously, thereby resulting in more current consumption. To solve these problems, there are known two technique in the state of the art, namely, a split word line divided in row or a division of in/out pair line in column into a global in/out line pair (GIO/GIOB) and a sub in/out pair line (SIO/SIOB). Referring to a semiconductor memory device proposed by "Hyundai Electronics Co., Ltd.", one of the major semiconductor device manufacturers in the Republic of Korea, in a publication entitled "8-bank synchronous DRAM" of the International Solid State Circuits on Conference (ISSCC) published in the U.S. in February 1995, each bank thereof is provided with a row decoder, a column decoder and a data path, respectively, by which there is disclosed a structure that the global in/out line pairs provided to the each bank are incorporated into the main in/out line pairs. The global in/out line pairs GIO in each bank are coupled to the sub in/out line pairs SIO. FIG. 1 shows a prior art in/out channel control circuit for accessing data in memory cell arrays by dividing an input/output line pair in column into a global input/output line pair GIO/GIOB and a sub input/output line pair SIO/SIOB, as aforementioned.

Referring now to FIG. 1, there is shown the construction for connection between the sub in/out line pairs and the global in/out line pair within each memory block BLK0–BLKn, wherein "n" is a natural number, on the in/out channel of the prior art semiconductor memory device, in which a global in/out line pair GIO/GIOB is coupled to a plurality of sub in/out line pairs SIO/SIOB of the respective memory blocks BLK0 to BLKn. Between the global in/out line pair and the sub in/out line pairs of the memory blocks are respectively connected a in/out line pair switching circuit 12 and a precharge circuit 14.

The in/out line pair switching circuit 12 each includes first and second transmission gates 16 and 18 respectively coupled between the lines GIO and GIOB and the lines SIO and SIOB of the respective memory blocks BLK0 to BLKn, which transmission gates each having a pair of an NMOS transistor and PMOS transistor, and an inverter 20 for generation of a gate signal. The respective NMOS transistor is switched responsive to an activation of a block selection information signal BLSi, wherein "i" is a natural number, according to decoding of row address information, while the respective PMOS transistor is switched responsive to a logic

2

"low" signal of the inverter 20, both for a connection between the sub in/out line pairs SIO/SIOB and the global in/out line pair GIO/GIOB.

The precharge circuit 14 includes two NMOS transistors 22 and 24 each having a channel connected between a drain coupled to a voltage VBL (an operating power supply voltage of a memory chip) and the sub in/out lines SIO/SIOB, and an NMOS transistor having a channel connected between the pair lines SIO and SIOB for equalization, in which transistors all of their gates are commonly coupled to an output of the inverter 28 inverting the block selection signal BLSi. Hence, it will be seen that prior to activation of the block selection signal BLSi into a logic "low", that is, during a logic "high" status, the precharge circuit 14 make a precharge of the sub in/out line pair SIO/SIOB into the voltage VBL for the equalization.

The precharged sub in/out line pairs SIO/SIOB of the each memory block are respectively connected with a pair of bit lines BL/BLB coupled to the memory cell arrays MC0–MCn through each channel of column selection transistors 30 and 32. Between the bit line pair BL/BLB is connected a sense amplifier 34 for developing an electric potential on the bit line pair. In this construction, the respective gates of the column selection transistors in each memory block, extending in a direction of the bit lines, are connected to column selection lines CSLi–CSLj, wherein "i" and "j" are a natural number and "i"<"j", of a column decoder 38, which decodes the inputted column address information and activates into a logic "high" level either one of the column selection lines CSLi–CSLj, therefrom to select data of a memory cell array extended in a column line within a corresponding memory block.

In accordance with the above mentioned circuit construction, in order to access a memory cell array MC0 of the memory block BLK1, the block selection signal BLS1 is activated to a logic "high" and the column selection line CLSi is also activated to a logic "high". Here, assuming that in the memory cell arrays MC0 a word line has been selected and the sense amplifier 34 of a corresponding bit line pair BL/BLB has been activated, then the data sensed and amplified by the sense amplifier is transmitted to the sub in/out line pair SIO/SIOB in the memory block BLK1 through channels of the transistors 30 and 32. However, because for the other memory blocks BLK2–BLKn, the current bit line pair BL/BLB and the sub in/out line pair SIO/SIOB have been precharged to a ½ Vcc voltage level together, no potential changes occur in the sub in/out line pair SIO/SIOB although the bit line pair and the sub in/out line pair are connected to each other through the column selection transistors 30 and 32. Therefore, referring to the above construction, the prior art circuit of FIG. 1 uses the block selection signal BLSi to select either one of a plurality of sub in/out line pairs SIO/SIOB with respect to a single global in/out line pair GIO/GIOB.

Furthermore, as the above prior art circuit should be provided with an independent column decoder and data path for every memory block BLK0–BLKn, it will most likely result in an increase of chip size upon design of such a multi-bank semiconductor memory device, which may be very disadvantageous in achieving the high integration of a memory device.

SUMMARY OF THE INVENTION

It is therefore an object of the present invention to provide a data input/output channel control circuit for a semiconductor memory device for efficiently connecting the data from a bit line pair of memory cell arrays having multi-bank structure to a global in/out line pair.

It is another object of the present invention to provide a semiconductor memory device capable of transmission of only the data in a corresponding block bank through a global in/out line pair and sub in/out line pairs with bank selection information and block selection information.

It is still another object of the present invention to provide a semiconductor memory device with a multi-bank structure capable of construction with the smaller chip size than the prior art.

It is a further object of the present invention to provide a semiconductor memory device with the multi-bank structure provided with a data input/output path capable of minimizing its current consumption.

It is a still further object of the present invention to provide a semiconductor memory device with a plurality of banks capable of sharing a single column decoder for efficient operation of the multi-bank.

The above noted objects may be effected by providing a data in/out channel control circuit for a semiconductor memory device with multi-bank structure having a plurality of split banks each provided with memory cell arrays, each split bank having a plurality of bit line pairs and a sub in/out line pair connected through a column selection transistor pair, characterized by comprising a pair of global in/out lines, global column selection lines extending in a direction of the bit line pair, a column decoding means for activation of any one of the global column selection lines responsive to a decoding of the column selection information, local column selection lines connected to each gate of the column selection transistors, means for generating a bank selection signal for selecting at least one of the plurality of banks by decoding column selection information and row selection information, and a switching means for connecting the sub in/out line pair of the corresponding bank to the global in/out line pair as well as connecting the global column selection line to the local column selection line of the bank in response to the bank selection signal.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

A preferred embodiment of the data input/output channel control circuit with multi-bank structure according to the present invention will be described in detail with reference to the accompanying drawings, hereinafter.

Figure 2:
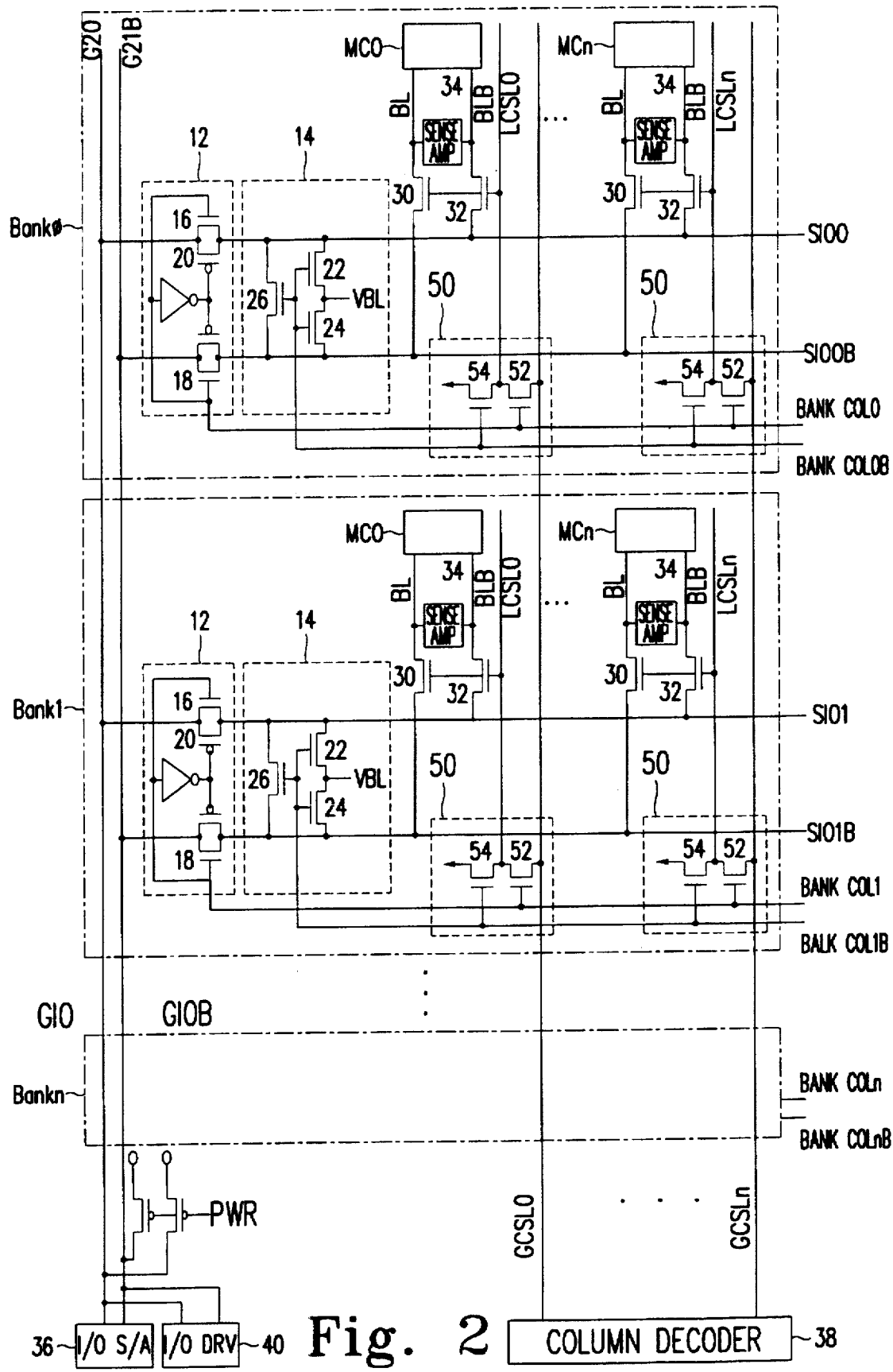
FIG. 2 is a circuit diagram showing an data input/output channel control circuit with multi-bank structure according to the present invention.

Turning now to the drawings. FIG. 2 is a schematic circuit diagram showing the preferred data input/output channel control circuit with multi-bank structure according to the present invention, wherein there are shown global column selection lines GCSLi, in which "i" is a natural number from "zero" to a given number "n". sub in/out line pairs SIOi and SIOBi, and memory cell arrays with their internal construction shown out partially, and wherein those reference symbols represented by a capital suffix "B" designate their inverted or complementary signal line or logic signal, respectively.

Figure 1:
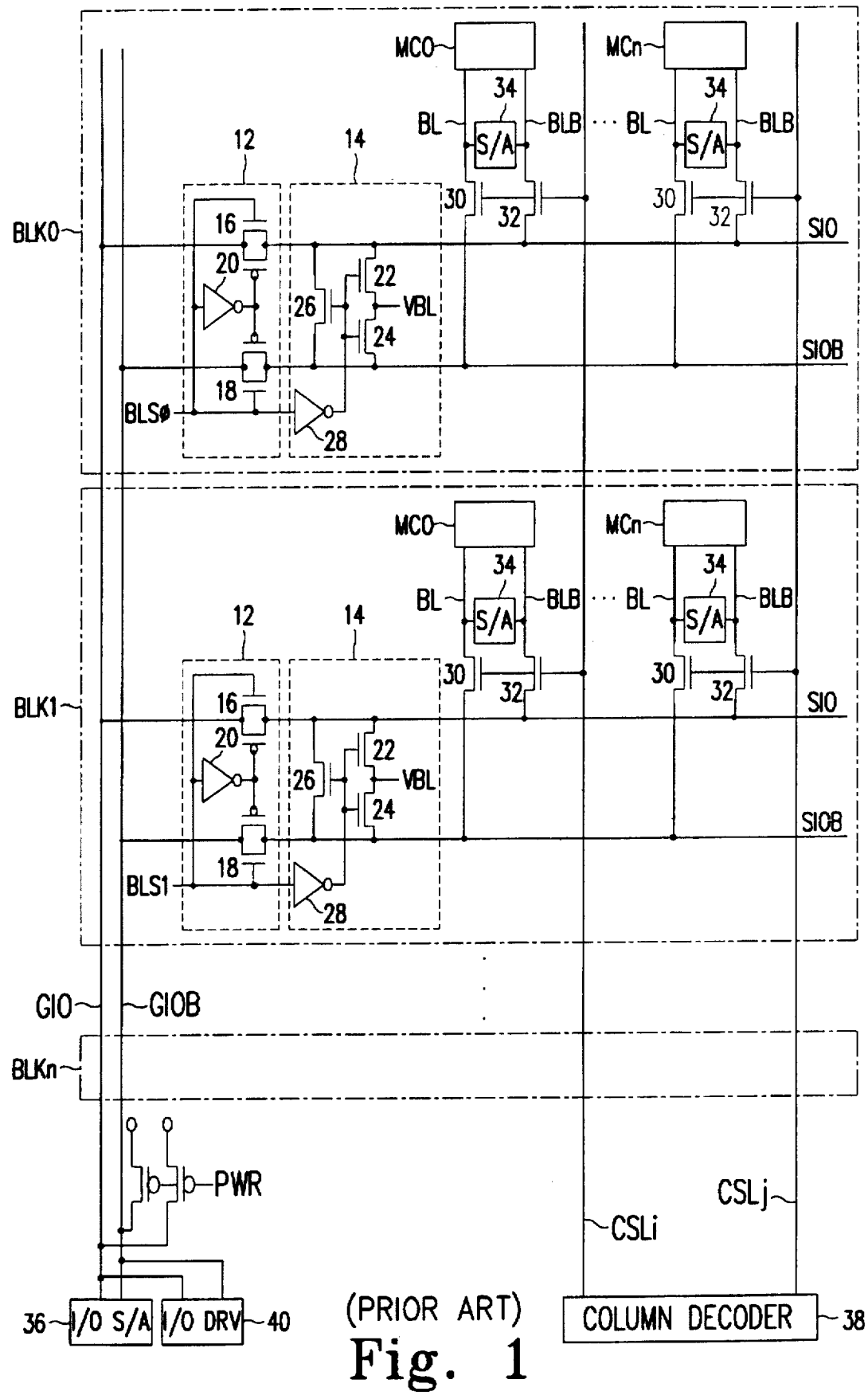
FIG. 1 is a circuit diagram showing an data input/output channel control circuit according to a prior art semiconductor memory device.

The entire memory arrays of a semiconductor memory device according to the present invention are divided into an "n" number of plurality of banks (Bank 0 to Bank n), wherein "n" is a natural number. A column decoder 38 is not provided to each bank of Bank 0 to Bank n as seen in FIG. 1, but rather shared by all the banks. The n number of global column selection lines GCSL0–GCSLn coupled to the column decoder 38 are extended in a direction of a bit line pair BL/BLB within the respective banks Bank 0 to Bank n in an identical manner. In the each bank are arranged the n number of memory cell arrays MC0–MCn each coupled to each bit line pair BL/BLB. To each bit line pair is connected a sense amplifier 34, and the bit line pair is coupled to the sub in/out line pair SIO/SIOB through a pair of column selection transistors 30 and 32. The respective memory cells MC0–MCn of all the banks from Bank 0 to Bank n are disposed to share a single sub in/out line pair SIO/SIOB, and between these sub in/out paired lines SIO and SIOB in each bank is connected a precharge circuit 14 for precharging the sub in/out line pair into a VBL voltage level of ½ Vcc responsive to activation of a bank selection signal BANK COLiB. wherein a suffix "i" is a given natural number. Further, between the sub in/out line pairs SIO and SIOB in each bank and a global in/out line pair GIO/GIOB is connected an in/out line pair switching circuit 12 for switching to connection of both line pairs in response to activation of a bank selection signal BANK COLi, wherein the suffix "i" is the same natural number.

In the meanwhile, each gate of the pair of column selection transistors 30 and 32 connecting the bit line pair BL/BLB with the sub in/out line pair SIO/SIOB is connected to a local column selection line LCSL0–LCSLn. respectively. These local column selection lines LCSL0–LCSLn are arranged with the same number of memory cell arrays MC0–MCn in the respective banks, extending in the direction of the bit line pair BL/BLB. The connection between a given global column selection line GCSLi and a given local column selection line LCSLi is made by means of a column selection switch 50 controlled by the bank selection signals BANK COLi/BANK COLiB.

The column selection switch 50 includes an NMOS transistor 52 having a channel connected between the global column selection line GCSLi and the local column selection line LCSLi and a gate connected to the bank selection signal BANK COLi, and another NMOS transistor 54 having a channel connected between a ground voltage Vss and the local column selection line LCSLi and a gate connected to the bank selection signal BANK COLiB. Hence, to a single global column selection line GCSLi is coupled the N number of local column selection lines through the same number of column selection switches 50. Here, the bank selection signal BANK COLi is activated upon each access cycle of a row address and a column address.

The in/out line pair switching circuit 12 has the same construction as shown in FIG. 1 and switches to a connection between the global in/out line pair GIO/GIOB and the sub in/out line pair SIO/SIOB in the corresponding bank in response to activation of a bank selection signal BANK COLi, for example, a logic "high" signal generated by a logic combination of the block selection information and the column selection information. Additionally, the precharge circuit 14 has the same construction as shown in FIG. 1 and precharges the sub in/out line pair SIO/SIOB within the corresponding bank into the VBL level for the voltage equalization between both of these pair lines in response to activation of a bank selection signal BANK COLiB, for example, a logic "high" signal generated by a logic combination of the block selection information and the column selection information.

Figure 3:
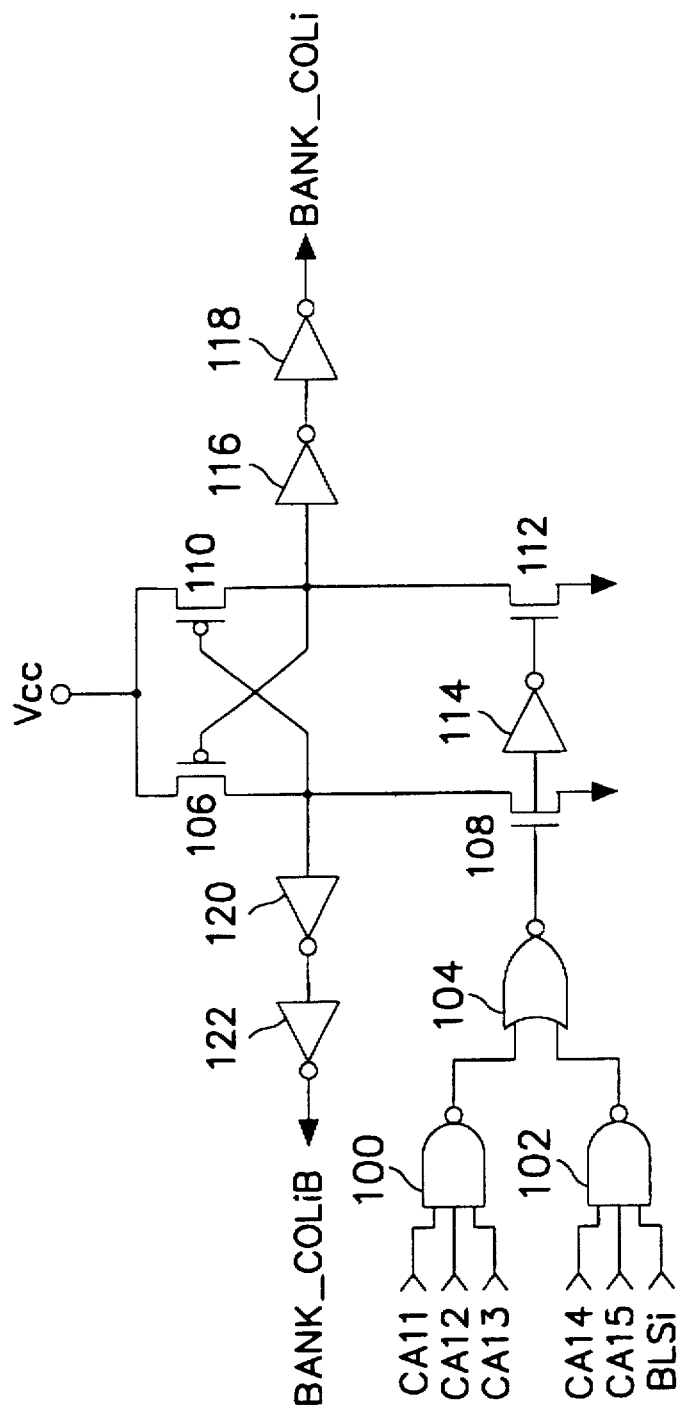
FIG. 3 is a circuit diagram showing a preferred embodiment of a column selection switch control circuit according to the present invention.

The respective data access in the memory cell arrays MC0–MCn within the multi-bank of Bank 0–Bank n according to the present invention having the construction as above described is carried out responsive to the activation of the global column selection line GCSLi from the column decoder 38 as well as the bank selection signals BANK COLi and BANK COLiB provided from a column selection switch control circuit as in FIG. 3.

FIG. 3 is a detailed circuit diagram showing a preferred embodiment of a column selection switch control circuit according to the present invention, for controlling operation of the NMOS transistors 52 and 54 in the column selection switching circuit 50, the in/out line pair switch 12 and the precharge circuit 14. The circuit of FIG. 3 is enabled in response to the activation of the block selection signal BLSi by decoding of the row address signal, for example, by a logic "high" state. Accordingly, it is appreciated that the column selection switch control circuit selects an operating block by the row address signal. In the activation status into logic "high" of the block selection signal BLSi, if the bank selection information inputted to NAND gates 100 and 102, that is, column address signals CA11–CA13 are logic "high", then NOR gate 104 provides logic "high signal to an inverter 114 and a gate of an NMOS transistor 108. Hence, the NMOS transistor 108 is turned "ON" and an NMOS transistor 112 connected to the inverter 114 is turned "OFF". Once the NMOS transistor 108 is turned "ON", its source is connected to a power supply voltage Vcc and a PMOS transistor 110 whose drain is connected to a drain of the transistor 112 and whose gate is connected to a drain of the transistor 108 is turned "ON". At this time, a PMOS transistor 106, whose source is connected to the power supply voltage Vcc, the drain is connected to the drain of the transistor 108 and the gate is connected to the drain of the transistor 112, is turned "OFF". Thus, if the NOR gate 104 outputs a logic "high" signal, then the bank selection signal BANK COLi supplied at output of an inverter 118 coupled in series to an inverter 116 is activated into logic "high" status while the inverted bank selection signal BANK COLiB supplied at output of an inverter 122 coupled in series to an inverter 120 is activated into logic "low" status.

In case where either the block selection signal BSLi is changed to non-activation status or any one of the column address signals CA11–CA15 for bank selection is logic "low", the outputs of the bank selection signals BANK COLi and BANK COLiB are transferred into the contrary status. Therefore, a desiable bank selection signal is activated by properly setting the column address signals for bank selection and the block selection information.

Now, if the row address signal and the column address signal are provided from the outside of the memory chip, then an operating block is determined by inputting of the row address signal, and a word line of the memory cell arrays positioned in at least one bank of the plurality of banks Bank 0–Bank n is activated. Further, at least one global column selection line of the plurality of global column selection lines GCSL0–GCSLn is activated by the operation of the column decoder 38 receiving and decoding the column address signal. As a result, if the row address signal and the column address signal are inputted into the memory chip, then any one of the plurality of global column selection lines GCSL0–GCSLn is activated and then any one bank selection signal of the plurality of the bank selection signals BANK COL0/BANK COL0B–BANK COLn/BANK COLnB is activated by the column selection switch control circuit of FIG. 3.

For example, in case that the word line and the sense amplifier 34 in a memory cell array MC0 of the Bank 0 is activated to transmit data into a bit line pair BL/BLB, the global column selection line GCSL0 of the plurality of global column selection lines GCSL0–GCSLn is activated into logic "high" status, and by the operation of the column selection switch control circuit the bank selection signals BANK COL0/BANK COL0B are activated (wherein the BANK COL0 is "high" and the BANK COL0B is "low") to thereby operating the column selection switch 50. Thus, the precharge circuit 14 of the corresponding bank of Bank 0 is disabled to stop the precharging operation.

In the meanwhile, the global column selection signal of logic "high" level applied to the global column selection lines GCSL0 by the operation of the column selection switch 50 is delivered to the local column selection line LCSL0 through a drain-source channel of the NMOS switching transistor 52 turned "ON" by the bank selection signal BANK COL0 of logic "high" level. At this time, the NMOS transistor 52 in the column selection switch 50 connected to the ground voltage Vss is turned "OFF" by the bank selection signal BANK COL0B of logic "low" level. Accordingly, as a logic "high" level of column selection signal is applied to gates of the column selection transistors 30 and 32, the bit line pair BL/BLB is connected to the sub in/out line pair SIO/SIOB in the selected bank of Bank 0, thereby transmitting the data read out of the memory cell array MC0 of Bank 0 onto the sub in/out line pair SIO/SIOB of the bank.

The data transmitted into the sub in/out line pair SIO/SIOB of the bank is delivered to the global in/out line pair GIO/GIOB through the in/out line pair switching circuit 12 connected thereto responsive to activation of the bank selection signal BANK COL0. At this moment, the in/out line sense amplifier 36 connected to the global in/out line pair GIO/GIOB does sense and amplify an amount of current difference caused due to a potential difference between the paired bit lines BL and BLB developed in the global in/out line pair GIO/GIOB, therefrom transmitting the sensed data into an external device as necessary.

In the foregoing operation, the column selection switch control circuit of other banks not selected provides logic "low" of bank selection signal BANK COLi and logic "high" of bank selection signal BANK COLiB, so as to electrically isolate the global column selection line GCSLi and the local column selection line LCSLi within the corresponding bank. Then, the precharge circuit 14 connected to the sub in/out line pair SIO/SIOB in other banks not selected precharges the sub in/out line pair SIO/SIOB into the VBL level responsive to the activation of the bank selection signal BANK COLiB.

As a result, it will be well appreciated that as the bank selection signals BANK COLi and BANK COLiB are activated responsive to the global column selection line GCSLi activated during one column access cycle, there could be avoided any excessive current consumption and requirement of additional precharging operation, resulting from connection of more than one bit lines and sub in/out lines, as such in the prior art shown in FIG. 1. For instance, even in case where both the word line and the sense amplifier are activated simultaneously in the memory cell array MC0 of Bank 0 and the memory cell array MC0 of Bank 1, only the bank selection signal BANK COL1 is activated into logic "high" level ("low" level for the bank selection signal BANK COL1B) by operation of the column selection switching control circuit of FIG. 3 for decoding the column address for the bank selection, and the block selection signal BLSi, whereas the remaining bank selection signals BANK COL2–BANK COLn are activated into logic "low" level ("high" level for the bank selection signals BANK COL2B–BANK COLnB), so that the local column selection lines LCSL0 of the other banks Bank 2–Bank n except for the local column selection line LCSL0 in the Bank 0 are not connected to the global column selection lines GCSL0. Accordingly, the remaining sub in/out line pairs SIO1/SIO0B–SIOn/SIOnB except for the sub in/out line pairs SIO0/SIO0B are not connected to the corresponding bit line pairs.

The column selection switch 50, the in/out line pair switch 12 and the precharge circuit 14 in the banks Bank 1–Bank n which were not selected according to the logic status ("low" for the BANK COLi and "high" for the BANK COLiB) of the bank selection signals BANK COLi/BANK COLiB operate in the contrary manner. In other words, since the NMOS transistor 52 connected to the global column selection lines GCSLi in the column selection switch 50 of the non-selected bank is turned "OFF" and the transistor 54 having the source connected to the ground is turned "ON", the electric potential on the local column selection lines LCSLi corresponding to the global column selection line GCSLi is driven to the ground voltage. In addition, as the transmission gates 16 and 18 in the in/out line pair switch 12 of the non-selected bank are all turned "OFF", the electrical connection between the global in/out line pair GIO1/GIO1B and the sub in/out line pairs SIO1/SIO0B–SIOn/SIOnB of the corresponding bank is cut off. Furthermore, all the NMOS transistors in the precharge circuit 14 of the non-selected bank are turned "ON", thereby precharging the sub in/out line pairs SIO1/SIO0B–SIOn/SIOnB into the VBL voltage level.

According to the foregoing circuit of the present invention, in case that different banks are successively selected, the operation of the column selection switching control circuit corresponding to each bank allows easier transition of banks. For instance, even though the activation status of the global column selection line GCSL1 provided from the column decoder 38 has been not altered, the bank selection signal BANK COL0 outputted from the column selection switching control circuit of the Bank 0 is driven to the non-activation status, logic "low" level if the column address signal to select the Bank 1 is received. Accordingly, as the bank selection signal BANK COL1 supplied at the column selection switching control circuit of the Bank 1 is activated to make electrical connection of the local column selection line LCSL1 of the Bank 1 to the global column selection line GCSL1, it will be appreciated that the effective bank transition within the identical column could be achieved with ease.

As apparent from the foregoing description, as the switching operation of the global in/out line and the sub in/out lines and the precharging operation of the sub in/out lines are controlled by means of the bank column selection address and the row block address in the bank, the inventive data in/out channel control circuit is capable of preventing the excessive current consumption and malfunction of the sub in/out lines in floating, even if more than one array blocks connected to the global in/out line should simultaneously perform the bit line sensing operation and be operated by the same column selection lines. Moreover, as a plurality of banks can share a column, the invention can reduce the load applied to the global in/out line pair and carry out easier bank transition, thereby taking advantages in high speed operation.

Although the foregoing embodiment disclosed heretofore uses the column selection switch set forth in FIG. 3, it will be appreciated that the column selection switching means with a different construction well known in the art may be embodied if desired. For instance, various auxiliary means may be added to the inventive circuit in order to overcome problems caused by signal transmission on the column selection lines. Furthermore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A data in/out channel control circuit for use in a semiconductor memory device having a plurality of banks provided with split memory cell arrays and a pair of global in/out lines, the banks each comprising:

multiple pairs of bit lines and a pair of sub in/out lines connected together through a pair of column selection transistors;

a bank selection circuit generating a bank selection signal according to a combination of column bank selection information and row selection information; and an in/out switching circuit connecting the pair of sub in/out lines of the bank to the pair of global in/out lines according to the bank selection signal.

2. The data in/out channel control circuit according to claim 1 wherein the in/out switching circuit comprises a first transmission gate connected between a first one of the global in/out lines and a first one of the sub in/out lines responsive to the bank selection signal and a second transmission gate connected between a second one of the global in/out lines and a second one of the sub in/out lines responsive to the bank selection signal.

3. A data in/out channel control circuit according to claim 1 including:

multiple global column selection lines each associated with one of the memory cells in each bank; and a column selection switch selectively coupling the global column selection lines with the pair of column selection transistors according to the bank selection signal.

4. A data in/out channel control circuit according to claim 3 wherein the in/out switching circuit and the column selection transistors are both turned-off and turned-on at the same time by the bank selection signal.

5. A data in/out channel control circuit according to claim 1 including a precharge circuit connected between the pair of sub in/out lines for precharging and equalizing the first and second sub in/out lines into a given voltage level in response to the bank selection signal.

6. A data in/out channel control circuit including a pair of global in/out lines coupled to a plurality of memory banks each having memory cell arrays including a plurality of bit line pairs and a pair of sub in/out lines connected through a pair of column selection transistors, the memory banks comprising:

a precharge circuit connected between the pair of sub in/out lines for precharging and equalizing the sub in/out lines into a given voltage level;

a bank selection control circuit generating a bank selection signal and a precharge control signal associated with a selected one of the multiple banks according to a combination of column bank selection information and row selection information, the bank selection signal enabling connection of the pair of sub in/out lines in the selected bank with the pair of global in/out lines; and the precharge signal activating the precharge circuit for precharging non-selected banks.

7. A data in/out channel according to claim 6 wherein the bank selection control circuit in each bank comprises logic circuitry receiving multiple column address signals and a block selection signal, the logic circuitry decoding the column address signals and block selection signal into the bank selection signal and inverting the bank selection signal for generating the precharge signal.

8. A data in/out channel according to claim 6 including:

global column selection lines;

a column selection switching circuit that selectively couples the global column selection lines to the column selection transistors according to the bank selection signal.

9. A data in/out channel according to claim 6 wherein the column selection switching circuit comprises the following:

a first transistor having a gate coupled to the bank selection signal and a channel coupled between one of the global column selection lines and gates of the column selection transistors; and a second transistor having a gate coupled to the precharge signal and a channel coupled between the gates of the column selection transistors and ground.

10. A control circuit for use in a semiconductor memory device having a plurality of split blocks of memory cell arrays, each split block having a plurality of bit line pairs and a sub in/out line pair connected through a column selection transistor pair, comprising:

a global in/out line pair connected to each of the plurality of split memory array blocks for enabling operation of corresponding word line and bit line sense amplifiers in at least two memory array blocks in the split memory array blocks; and a switching circuit for connecting the sub in/out line pair with the global in/out line pair according to a row block address and a column address.

11. A method for controlling data in/out in a semiconductor memory device, comprising:

connecting a pair of global in/out lines to a plurality of banks having memory cell arrays;

selecting one of the banks according to a combination of column addresses and row addresses;

connecting bit lines associated with the selected one of the banks with a pair of sub in/out lines;

connecting the sub in/out lines of the selected one of the banks with the global in/out lines;

disconnecting the sub in/out lines associated with nonselected banks from the global in/out lines; and precharging the sub in/out lines associated with nonselected banks.

12. A memory device, comprising:

a plurality of banks provided with split memory cell arrays and a pair of global in/out lines;

multiple pairs of bit lines and a pair of sub in/out lines connected together through a pair of column selection transistors;

a bank selection circuit generating a bank selection signal according to a combination of column bank selection information and row selection information; and an in/out switching circuit connecting the pair of sub in/out lines of the banks to the pair of global in/out lines according to the bank selection signal.

* * * * *

UNITED STATES PATENT AND TRADEMARK OFFICE
CERTIFICATE OF CORRECTION

PATENT NO. : 5,761,146
DATED : June 2, 1998
INVENTOR(S) : Yoo et al.

It is certified that error appears in the above-identified patent and that said Letters Patent is hereby corrected as shown below:

Column 5,
Line 58, "desiable" should read -- desireable --.

Column 7,
Lines 20, 39 and 43, "SIO1/SIO0B" should read -- SIO1/SIO1B --.

Signed and Sealed this

Thirtieth Day of July, 2002

*Attest:*

*Attesting Officer*

JAMES E. ROGAN
*Director of the United States Patent and Trademark Office*